United States Patent [19]

Olivo et al.

[11] Patent Number: 5,081,610
[45] Date of Patent: Jan. 14, 1992

[54] REFERENCE CELL FOR READING EEPROM MEMORY DEVICES

[75] Inventors: Marco Olivo, Bergamo; Carlo Riva, Monza, both of Italy

[73] Assignee: SGS-Thomson Microelectronics Srl, Agrate Brianza, Italy

[21] Appl. No.: 491,903

[22] Filed: Mar. 12, 1990

[30] Foreign Application Priority Data

Mar. 23, 1989 [IT] Italy .................. 19875 A/89

[51] Int. Cl.$^5$ .................. G11C 7/00; G11C 16/04; G11C 16/06
[52] U.S. Cl. .................. 365/104; 365/185; 365/189.09; 365/175; 365/210
[58] Field of Search .......... 365/185, 184, 104, 189.07, 365/210, 189.09, 149, 174, 175; 357/23.5

[56] References Cited

U.S. PATENT DOCUMENTS

| | | | |
|---|---|---|---|
| 4,780,750 | 10/1988 | Nolan et al. | 365/185 X |
| 4,802,124 | 1/1989 | O'Brien, Jr. | 365/185 |
| 4,811,291 | 3/1989 | de Ferron | 365/210 X |
| 4,823,316 | 4/1989 | Riva | 365/185 |
| 4,845,680 | 7/1989 | Iwahashi | 365/185 |
| 4,937,787 | 6/1990 | Kobatake | 365/104 X |

*Primary Examiner*—Alyssa H. Bowler
*Attorney, Agent, or Firm*—Guido Modiano; Albert Josif

[57] ABSTRACT

A reference cell for reading EEPROM memory devices, capable of discharging any charges present in its own floating gate without varying the geometry of the cell with respect to that of the associated memory cells and without requiring specific manufacturing steps. For this purpose, a switch element, for example a diode, is provided between the floating gate and the substrate of the device and discharges any charges present in the floating gate toward the substrate during the cell idle state in the absence of read signals.

6 Claims, 2 Drawing Sheets

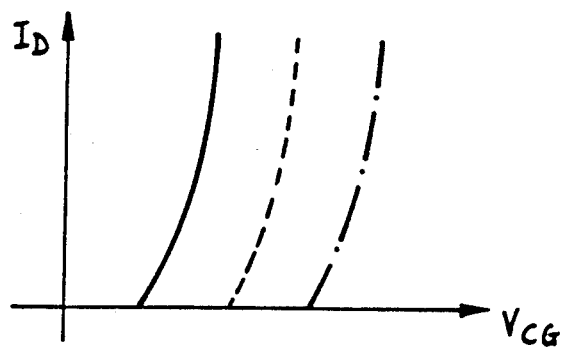
Fig. 1
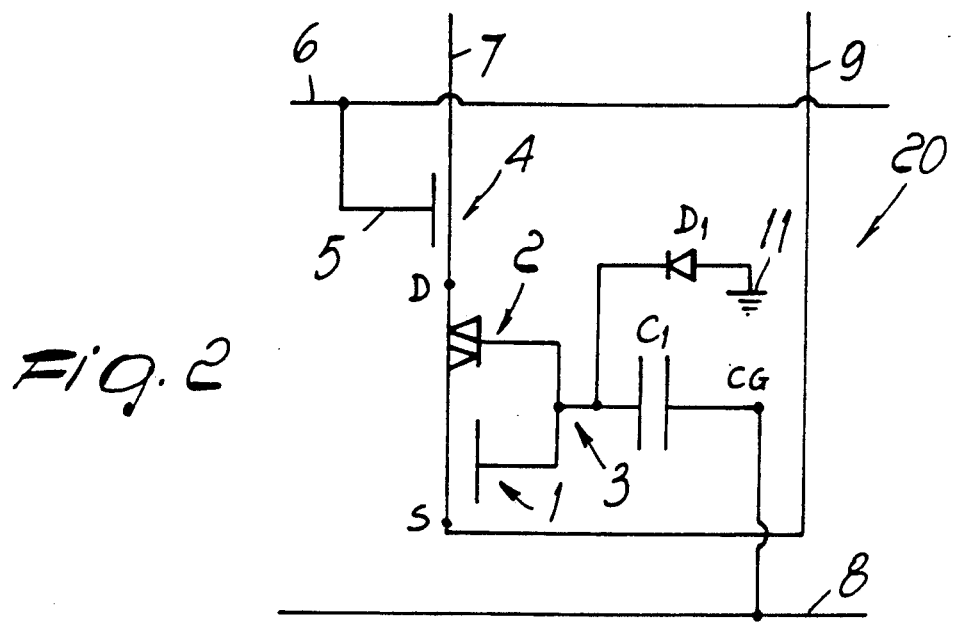
Fig. 2
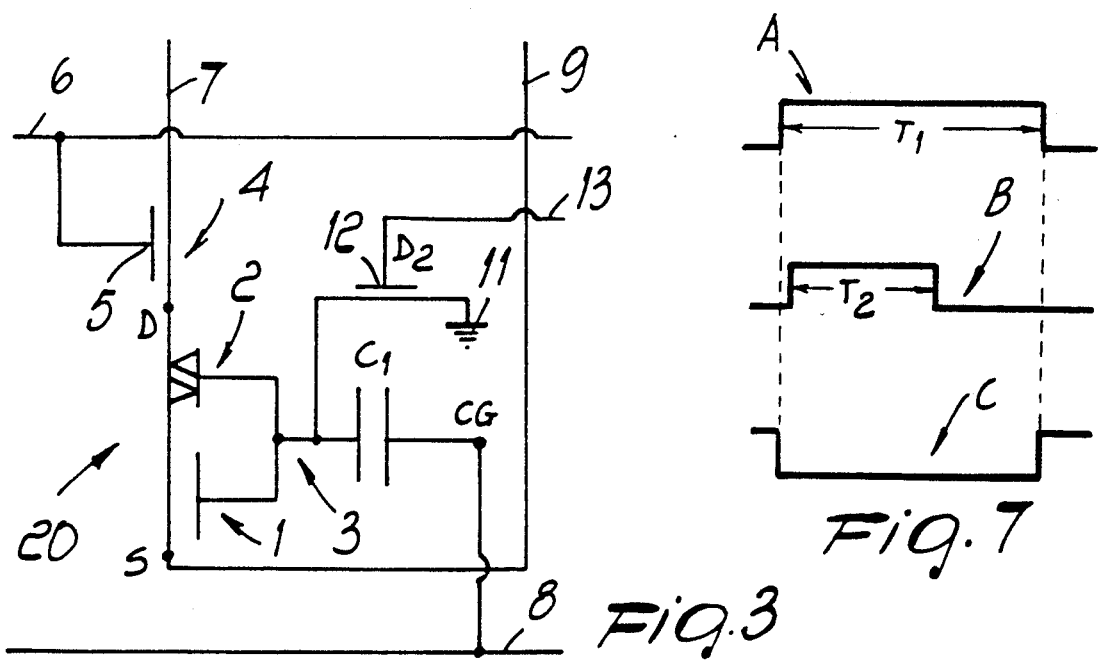
Fig. 3
Fig. 7

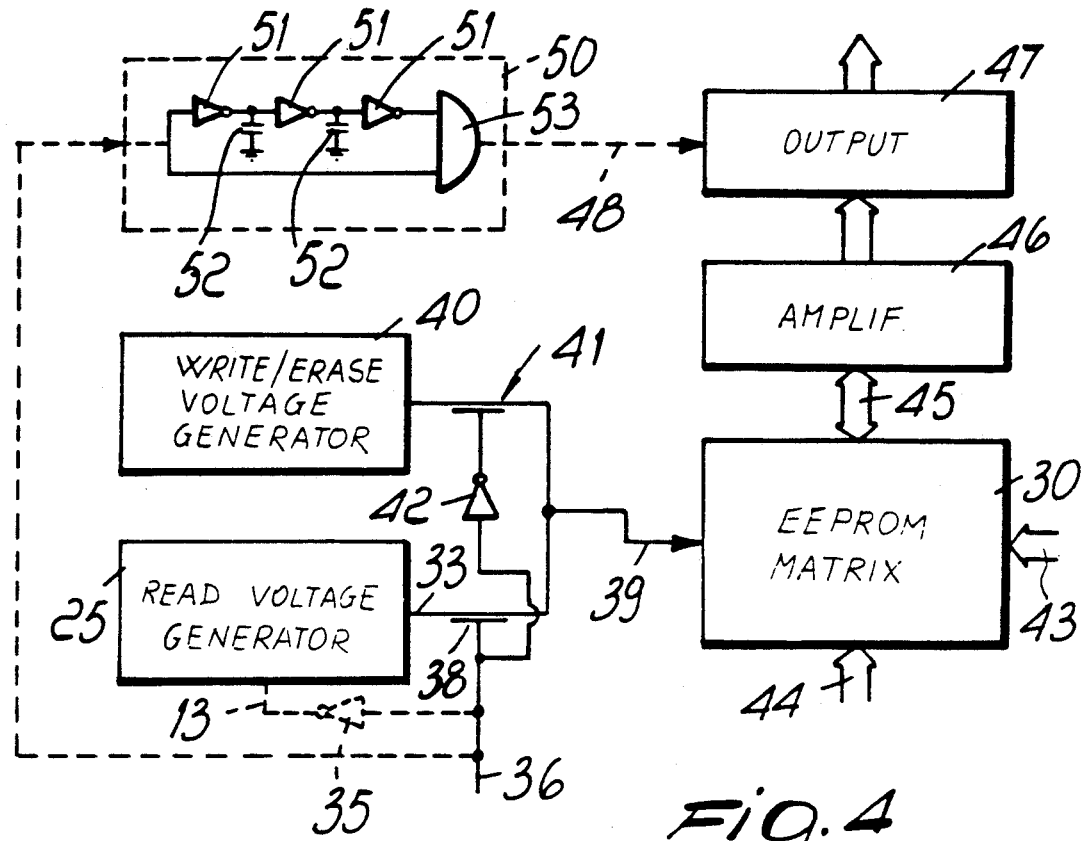
Fig. 4
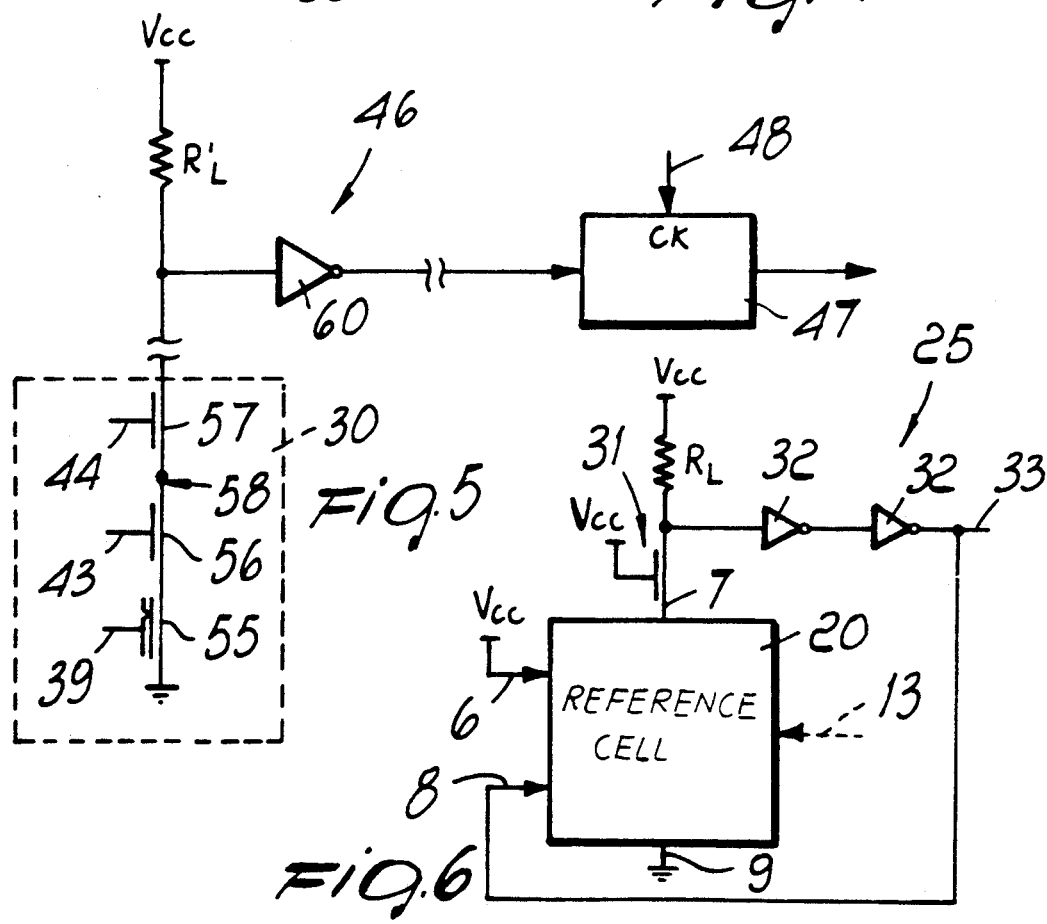
Fig. 5
Fig. 6

REFERENCE CELL FOR READING EEPROM MEMORY DEVICES

BACKGROUND OF THE INVENTION

The present invention relates to a reference cell for reading EEPROM memory devices.

As is known, for reading memory cells of EEPROM devices reference cells (also known as "dummy cells") are frequently used for generating the read voltage of said memory cells. Said read voltage must be comprised between the threshold voltage of a written cell (i.e. charged with positive charges in the floating gate) and the threshold voltage of an erased cell (i.e. charged with negative charges in the floating gate). Since the reference cells are manufactured during the same process for making the memory cells and are operated in the same conditions as said memory cells, they are capable of "following" the variations of process parameters (e.g. the increase in the current delivered by a cell due to different oxide thicknesses, all other parameters being equal) and the operating conditions so as to ensure an exact reading of the memory device.

For this purpose, virgin cells, i.e. cells which are never programmed in one way or the other, are currently used as reference cells, since they have a characteristic which is comprised between the characteristic of written cells and that of erased cells (see FIG. 1).

For allowing said virgin cells to reliably and accurately perform their task, they must keep their threshold voltage constant throughout the device entire life. However, various factors can have a negative effect so as to vary their characteristics.

In particular, it is known that during silicon working said silicon is subjected to strong electric fields and to ion bombardment. This entails that at the end of the process the floating gates (and therefore the gate of the reference cell as well) are charged in a random manner, thus varying the electric characteristics of the reference cell.

Furthermore, it is also known that floating gates can be electrostatically charged during the operations for packaging the finished devices.

Further problems can arise during the life of the device, due to oscillations of the voltage applied to the reference cell, which can cause the introduction of charges into the floating gate of the latter.

Various solutions have been proposed in order to solve the above described problems. One of them provides exposure of the processed wafers to ultraviolet rays before the final check test. This exposure requires the use of a passivation which is transparent to ultraviolet rays and is simultaneously impermeable to moisture, with obvious disadvantages as regards greater structural complexity and costs for the execution of this method step.

Another solution entails the use of particular devices and procedures during the packaging step in order to reduce the electrostatic charges. This solution is also not free from disadvantages, due to the greater costs related to the special devices and to the need to provide special procedures.

Finally, it has also been proposed to eliminate the tunnel element, i.e. the thin oxide region (100 Å) between the floating gate and the drain region of the reference cell, so as to prevent accidental programming due to the Fowler-Nordheim effect. In this manner, however, the morphology of the reference cell differs appreciably from that of the cells of the memory array. In particular, sensitivity to variations in the thickness of the tunnel oxide, which is a parameter of primary importance in determining capacitive couplings, is lost.

SUMMARY OF THE INVENTION

Therefore, the aim of the present invention is to provide a reference cell for reading EEPROM memory devices which is capable of eliminating the disadvantages of the prior art and in particular a reference cell which has electric features which correspond to the ideal ones of virgin cells and remain constant in the course of time.

Within the above described aim, a particular object of the present invention is to provide a reference cell capable of eliminating the electric charges which can accumulate in the floating gate of the cell for any reason during the manufacture or operation of the memory device.

An important object of the present invention is to provide a reference cell which has electric features depending on the different process parameters which are as much as possible similar to the features of the cells of the memory device.

Another object of the present invention is to provide a reference cell of the described type which does not entail significant complications in the structure of the cell and does not require particular process steps to achieve the above described aim.

Not least object of the present invention is to provide a reference cell which is highly reliable and which does not require, for its manufacture, devices or procedures which differ from those commonly in use in the electronics industry.

This aim, the objects mentioned and others which will become apparent hereinafter are achieved by a reference cell for reading EEPROM memory devices, as defined in the accompanying claims.

BRIEF DESCRIPTION OF THE DRAWINGS

The characteristics and advantages of the invention will become apparent from the description of two preferred embodiments, illustrated only by way of non-limitative example in the accompanying drawings, wherein:

FIG. 1 plots the current-voltage characteristic of an EEPROM cell, with constant $V_D$, in the case of a written cell, a virgin cell and an erased cell;

FIG. 2 is a circuit diagram of a first embodiment of the cell according to the invention;

FIG. 3 is a circuit diagram of a second embodiment of the cell according to the invention;

FIG. 4 is a block diagram of a circuit for reading and writing an EEPROM array, in which the reference cell according to the invention is used;

FIGS. 5 and 6 are general circuit diagrams of two blocks of the diagram of FIG. 4; and FIG. 7 plots some signals generated in the circuit of FIG. 4.

DESCRIPTION OF THE PREFERRED EMBODIMENTS

FIG. 1 plots the behavior of the drain current $I_D$ as a function of the control gate voltage $V_{CG}$ of an EEPROM cell of the considered kind in the case of a written cell (a cell having positive charges in the floating gate), as indicated by a solid line, of a virgin (i.e. not programmed) cell, as indicated by the broken line, and of an erased cell (i.e. a cell having negative charges in the floating gate), as indicated by the dot-and-dash line. As can be seen, the characteristic of the virgin cell is comprised between that of a written cell and that of an erased cell, so that it is convenient to use a virgin cell as the reference cell.

With reference to FIGS. 2 and 3, two embodiments of the present invention are now illustrated; said embodiments allow to eliminate any charge which might accumulate in the floating gate during the various steps for manufacturing the memory device or during its operation and thus ensure the reliable and accurate operation of the reference cell.

FIG. 2 illustrates a first embodiment, according to which the floating gate of a per se known reference cell is connected to the substrate by means of a diode. In detail, the reference cell (generally indicated at 20) is electrically represented by a sensing transistor 1 and by a tunneling diode 2, whereas the common point 3 represents the cell floating gate. The cell furthermore comprises, in a known manner, a transfer gate transistor 4 connected between the drain terminal D and the bit line 7, the gate terminal 5 whereof is connected to the word line 6. A coupling capacitor $C_1$ is furthermore present, still in a known manner, between the floating gate 3 and the control gate CG, whereas the latter is connected to a control gate line 8. The source terminal S of the cell, finally, is connected to the source line 9 which is connected or not to the ground. According to a first embodiment of the invention, the cell furthermore comprises a diode $D_1$, connected between the floating gate and the substrate (symbolically indicated by the ground line 11). In the drawing, the anode of the diode is connected to the substrate and its cathode is connected to the floating gate. In particular, the diode can be obtained by forming in the substrate an $N^+$ doped region, if the substrate is of the P type (as in the example illustrated in FIG. 2), or a $P^+$ type region, if the substrate is of the N type, and by electrically connecting said doped region to the floating gate by means of a metallic connection.

Consequently, by virtue of the presence of the diode $D_1$, any charge present in the floating gate is discharged (by leakage) toward the substrate during the cell idle intervals. In read conditions, instead, the floating gate is raised to a positive potential by capacitive coupling across $C_1$, thus reverse-biasing $D_1$. In such conditions, the capacity associated with $D_1$ tends to discharge by leakage, but the time required for such discharge is very long if compared to the read times of the reference cell. The read operation is therefore not altered significantly by the presence of $D_1$. At the end of the readout operation, the terminal of the control gate, connected to the line 8, is returned to ground voltage, restoring the initial conditions, i.e. with the floating gate connected to the ground and $D_1$ in equilibrium condition. On the contrary, if the readout operation occurs with a low frequency, in the limit in static conditions, a circuit which limits the read time to the initial read step, in which the floating gate has not yet had the time to discharge through $D_1$, is required. This solution is described in greater detail hereafter with reference to FIGS. 4 to 7.

FIG. 3 shows a different embodiment, in which the diode $D_1$ is replaced by a MOS transistor of the enhancement type. In detail, the reference cell 20 comprises, in this case as well, the sensing transistor 1 and the tunneling diode 2, which are connected at the floating gate 3, and the transfer gate transistor 4. In this case as well, the gate transistor 4 is connected between the drain terminal D and the bit line 7 and, through the gate terminal 5, to the word line 6, whereas the floating gate 3 is connected to the control gate CG through a coupling capacitor $C_1$ and the source terminal S of the cell is connected to the source line 9. In this case as well, the line 8 represents the control gate line. According to this embodiment, the MOS transistor $D_2$, intended to allow discharge of the floating gate of the reference cell, is connected between said floating gate 3 and the substrate, which is indicated here, too, by the ground line 11. The gate terminal 12 of the transistor $D_2$ is furthermore connected to a control line 13 which receives a logical signal which is active when the cell is not in readout condition (see the signal indicated at C in FIG. 7, in which the signal A represents the readout signal). In this manner, the initial conditions (with floating gate and control gate connected to the ground) are rapidly restored at the end of the readout, whereas during reading, since the transistor $D_2$ is off, it does not affect the operation of the cell.

Reference should now be made to FIGS. 4–6, which illustrate diagrams of a memory system which uses the reference cell according to the invention. As already explained, the reference cell is used to generate the read voltage of an EEPROM memory array (indicated at 30 in FIG. 4) by virtue of its electric features. In particular, the read voltage generator 25 may be implemented by connecting the reference cell 20 as shown in FIG. 4, in which the source line 9 is connected to the ground, the word line 6 is connected to the power supply $V_{CC}$ and the bit line 7 is connected to a selection transistor 31. The latter, the gate terminal whereof is connected to the supply $V_{CC}$, is furthermore connected to a terminal of a load $R_L$ (which can be constituted by a transistor or by a more complex device), connected with its other terminal to the supply $V_{CC}$. The first terminal of $R_L$ is furthermore connected to a pair of inverters 32, the output 33 whereof is connected to the control gate line 8 and simultaneously constitutes the output of the reference voltage generator. If the reference cell is implemented according to the second embodiment, shown in FIG. 3, the cell 20 furthermore has its input 13 (shown in broken lines since it is present only for this second embodiment) connected, by means of an inverter 35, to the line 36 on which the readout READ command is supplied.

In the circuit of FIG. 6, which in any case represents merely a possible solution for generating the read voltage by using a virgin reference cell, there is only one stable state, and precisely when the voltage present on the output 33 is equal to the trigger voltage of the cell. Consequently, said diagram can generate a stable read voltage, corresponding to the characteristic shown in broken lines in FIG. 1 and being therefore suitable for use in an EEPROM memory array.

The output 33 of the generator 25 is then supplied, through an appropriate switch 38, to the control gate line 39 of the memory array 30, which is constituted by EEPROM cells. The write and erase voltages, generated by the generator 40 in a known manner, are also supplied to said line 39. Said voltages are then fed to the array at appropriate times, alternatively to the read voltage, by virtue of a switch 41 controlled by the read signal by means of an inverter 42, as shown schematically in the FIGURE. The EEPROM array 30 has, in an also known manner, an input 43 for row selection (corresponding to the word line) and an input 44 for column selection (receiving the signals controlling selection of the bit lines which should be connected, at that moment, to the output, indicated by the numeral 45). The output 45 is furthermore connected to a sensing and amplifying block (constituted by sense amplifiers) which is in turn connected at the output to an output buffer 47.

According to the invention, in order to eliminate any read errors, said output buffer 47 can have a control input 48 for both embodiments. As already explained earlier, in order to eliminate read errors in the case of a low read frequency, in the limit a static read frequency, it is in fact possible to provide a read time limiting circuit, such as for example the monostable circuit 50 of FIG. 4. Said monostable circuit can in turn be constituted by three inverters 51, cascade coupled and having two capacitors 52 between the output of an inverter and the input of the following one, and by an AND gate 53. In this diagram, given the READ signal at the input (which is a digital signal equal in length to an external clock period which depends on the frequency) such as the one indicated by A in FIG. 7 with a time length $T_1$, a pulse is generated at the output (signal B with time length $T_2$ of FIG. 7), the time length whereof can be changed by appropriately dimensioning the capacitors and inverters.

Said read time limiting circuit can be advantageously used for the second embodiment as well, as already mentioned, since even the MOS transistor does not provide an ideal switch, due to the source and drain diffusions having a leakage toward the substrate, exactly like the diode $D_1$. The use of the transistor $D_2$ has the advantage of causing a rapid discharge of the floating gate when the read frequency is high.

A more detailed layout of the part of the diagram of FIG. 4 which comprises the blocks 46, 47 (and is in any case of a conventional type) is shown in FIG. 5, which schematically illustrates one of the cells of the EEPROM array 30, which comprises a memory transistor 55 with tunnel structure, the control gate whereof is connected to the control gate line 39, a row selection transistor (transfer gate) 56, the gate terminal whereof is connected to the word line or row selection line 43, and a column selection transistor 57 the gate terminal whereof is connected to the column selection line 44. The point 58 represents the bit line.

The outputs of the transistors 57 of the memory array, appropriately joined, are connected to the sensing and amplifying block 46, which comprises a plurality of loads $R'_L$ and amplifiers 60, equal in number to the bits of each word. In particular, the load $R'_L$, which constitutes a sensing element, is identical to the load $R_L$ of the reference cell, so that the latter operates in conditions which are as similar as possible to those of the array cells. The output of the amplifiers 60 is then connected to the output buffer 47, typically constituted by a D-latch circuit which has a clock input which is connected to the output 48 of the read time limiting circuit 50, so that the output of the block 47 is sampled by the pulse provided by the monostable circuit 50.

As can be seen from the above description, the invention fully achieves the proposed aim and objects. A reference cell has in fact been provided which can be used for reading EEPROM memory devices and has features equal to those of virgin cells, by virtue of the possibility of eliminating any charge accumulated in the floating gate during any manufacture or operation step of the device.

The invention is furthermore circuitally simple, does not entail a high use of silicon area and does not require modifications to the manufacturing processes, so that it has manufacturing costs comparable to those of known cells despite having better electric features and high reliability.

The invention thus conceived is susceptible to numerous modifications and variations, all of which are within the scope of the inventive concept. In particular, the fact is stressed that though the element which allows the elimination of the accumulated charge toward the substrate is provided, in the illustrated embodiments, by a diode or a MOS enhancement transistor, any switch element capable of connecting the floating gate toward the substrate during the cell idle periods (isolating the gate from the substrate during readout, so as to not interfere with the cell actual operation) can be used for this purpose.

It is furthermore stressed that the illustrated diagrams for generating the read voltage and for limiting the read time or controlling the MOS $D_2$ are merely exemplifying.

All the details may furthermore be replaced with other technically equivalent elements.

We claim:

1. A reference cell for reading EEPROM memory devices, comprising a virgin cell including a semiconductor material body set at a reference voltage, source and drain regions and a discharged floating gate region capacitively coupled to a control gate, which define a sensing transistor and a tunnel diode, switch means being connected between said floating gate region and said semiconductor material body, for discharging by leakage any charges present in said floating gate region toward said semiconductor material body in a cell idle state.

2. A cell according to claim 1, wherein said switch means comprises a diode.

3. A cell according to claim 1, wherein said switch means comprises a transistor connected between said floating gate region and said semiconductor material body and provided with a control electrode for controlling switching off thereof during a cell read step.

4. A cell according to claim 3, wherein said transistor is a MOS transistor of the enhancement type.

5. A cell according to claim 4, comprising an inverter element connected to said control electrode of said
    MOS enhancement transistor, said inverter element receiving a read signal and generating a signal for switching off said enhancement MOS transistor.

6. A reference cell for reading EEPROM memory devices for use in a memory circuit comprising a read voltage generator and a memory array, said read voltage generator including said reference cell and said memory array having a control input connected to said read voltage generator and an output connected to a read data sensing and storing circuit, wherein said memory circuit comprises a read time limiting circuit receiving, at an input thereof, a read signal and generating a read signal with settable time length which is supplied to said read data sensing and storing circuit, said reference cell comprising a virgin cell including a semiconductor material body set at a reference voltage, source and drain regions and a discharged floating region capacitively coupled to a control gate, which define a sensing transistor and a tunnel diode, switch means being interposed between said floating gate region and said semiconductor material body, for discharging any charges present in said floating gate region toward said semiconductor material body in a cell idle state, wherein said switch means comprises a diode.

* * * * *